United States Patent
Williams et al.

(10) Patent No.: US 8,891,284 B2
(45) Date of Patent: Nov. 18, 2014

(54) MEMRISTORS BASED ON MIXED-METAL-VALENCE COMPOUNDS

(75) Inventors: R. Stanley Williams, Portola Valley, CA (US); Jianhua Yang, Palo Alto, CA (US); Matthew Pickett, San Francisco, CA (US); Gilberto Ribeiro, Menlo Park, CA (US); John Paul Strachan, Milbrae, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 99 days.

(21) Appl. No.: 13/383,572

(22) PCT Filed: Sep. 4, 2009

(86) PCT No.: PCT/US2009/056022
§ 371 (c)(1),
(2), (4) Date: Jan. 11, 2012

(87) PCT Pub. No.: WO2011/028208
PCT Pub. Date: Mar. 10, 2011

(65) Prior Publication Data
US 2012/0113706 A1 May 10, 2012

(30) Foreign Application Priority Data
Jul. 13, 2009 (JP) .................................. 2009-165134

(51) Int. Cl.
*G11C 11/00* (2006.01)
*H01L 21/8239* (2006.01)
*H01L 45/00* (2006.01)
*G11C 13/00* (2006.01)
*H01L 29/861* (2006.01)

(52) U.S. Cl.
CPC ............ *H01L 45/08* (2013.01); *G11C 2213/56* (2013.01); *G11C 13/0007* (2013.01); *G11C 13/003* (2013.01); *G11C 2213/55* (2013.01); *G11C 2213/72* (2013.01); *H01L 29/8615* (2013.01); *H01L 45/146* (2013.01); *H01L 45/1233* (2013.01); *G11C 2213/73* (2013.01)
USPC ...... 365/148; 257/2; 257/E45.003; 257/E21.004; 257/E21.645; 438/382

(58) Field of Classification Search
None
See application file for complete search history.

(56) References Cited

U.S. PATENT DOCUMENTS

2003/0173612 A1  9/2003  Krieger et al.
2006/0171200 A1  8/2006  Rinerson et al.
(Continued)

OTHER PUBLICATIONS

Leandro Liborio et al; Thermodynamics of oxygen defective Maméli phases in rutile: A first-principles study; Physical Review B 77, 104104;2008 The American Physical Society.

(Continued)

Primary Examiner — James G Norman
(74) Attorney, Agent, or Firm — David W. Collins

(57) ABSTRACT

A memristor based on mixed-metal-valence compounds comprises: a first electrode; a second electrode; a layer of a mixed-metal-valence phase in physical contact with at least one layer of a fully oxidized phase. The mixed-metal-valence phase is essentially a condensed phase of dopants for the fully oxidized phase that drift into and out of the fully oxidized phase in response to an applied electric field. One of the first and second electrodes is in electrical contact with either the layer of the mixed-metal-valence phase or a layer of a fully oxidized phase and the other is in electrical contact with the layer (or other layer) of the fully oxidized phase. The memristor is prepared by forming in either order the layer of the mixed-metal-valence phase and the layer of the fully oxidized phase, one on the other. A reversible diode and an ON-switched diode are also provided. A method of operating the memristor is further provided.

14 Claims, 2 Drawing Sheets

(56) References Cited

U.S. PATENT DOCUMENTS

| | | |
|---|---|---|
| 2006/0175598 A1 | 8/2006 | Krieger et al. |
| 2006/0175646 A1 | 8/2006 | Gaun et al. |
| 2007/0117256 A1 | 5/2007 | Stewart et al. |
| 2007/0269683 A1 | 11/2007 | Chen et al. |
| 2008/0048164 A1* | 2/2008 | Odagawa .......................... 257/2 |
| 2008/0090337 A1 | 4/2008 | Williams |

OTHER PUBLICATIONS

Extended European Search Report, Jun. 28, 2013. Patent Application No. 09849071.7. European Patent Office, Munich.

* cited by examiner

MEMRISTORS BASED ON MIXED-METAL-VALENCE COMPOUNDS

BACKGROUND ART

The continuous trend in the development of electronic devices has been to minimize the sizes of the devices. While the current generation of commercial microelectronics are based on sub-micron design rules, significant research and development efforts are directed towards exploring devices on the nano-scale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interest, and there are substantial on-going research efforts to further develop such nanoscale switches and to implement them in various applications. One of the many important potential applications is to use such a switching device as a memory unit to store digital data.

The devices recently reported using titanium oxide (and other oxides) typically have involved two oxide phases ($TiO_2$ and an oxygen-deficient phase, $TiO_{2-x}$). However, on-going work may be useful in clarifying and identifying suitable oxides, not only in the titanium system, but in other transition metal systems as well.

BEST MODES FOR CARRYING OUT THE INVENTION

Figures 1, 3A, 3B:
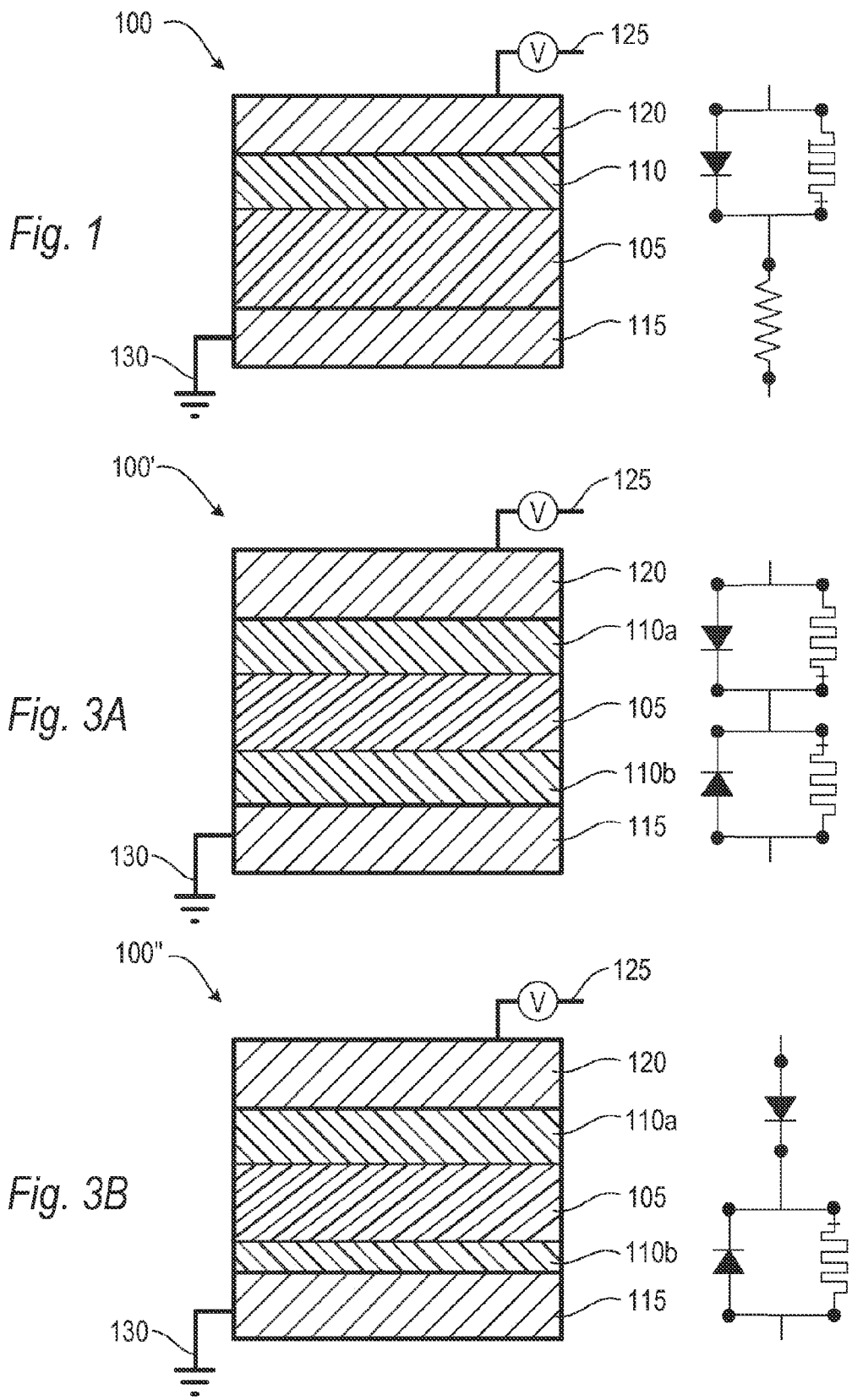
FIG. 1 is a schematic diagram, illustrating a memristor device in accordance with embodiments of the invention, along with its equivalent circuit.
FIG. 3A is a schematic diagram, illustrating another memristor device in accordance with embodiments of the invention, along with its equivalent circuit.
FIG. 3B is a schematic diagram, illustrating yet another memristor device in accordance with embodiments of the invention, along with its equivalent circuit.

Reference is made now in detail to specific embodiments, which illustrates the best mode presently contemplated by the inventors for practicing the invention. Alternative embodiments are also briefly described as applicable.

Previous work describes rnemristors comprising a switch having the following characteristics (see, e.g., R. Stanley Williams, US Patent Publication 2008/0090337A1, Apr. 17, 2008, the content of which is incorporated herein in its entirety):

A primary active layer, or region, of the switch comprises a thin film of a material that is electronically semiconducting or nominally electronically insulating and also a weakly ionic conductor. The primary active material is capable of transporting and hosting ions that act as dopants to control the flow of electrons through the switch. The basic mode of operation is to apply an electrical field (the drift field, which may exceed some threshold for enabling the motion of the ions in the primary material) across the switch large enough to cause an ionic species to be transported into or out of the primary material via ionic transport. The ionic species are specifically chosen from those that act as electrical dopants for the primary material, and thereby change the electrical conductivity of the material from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). Furthermore, the primary material and the dopant species are chosen such that the drift of the ions into or out of the primary material is possible but not too facile, to ensure that the switch will remain in whatever state it is set for a reasonably long time, perhaps many years at room temperature. This is to make sure the switch is nonvolatile, that is, that it holds its state after the drift field has been removed. The switch is a two-terminal device—applying a high bias to the switch causes both electron current and ion current to flow, whereas at a low bias the flow of ion current is negligible, which allows the switch to hold its resistance state.

A secondary active layer, or region, comprises a thin film of a material that is a source of dopants for the primary material. These dopants may be impurity atoms such as hydrogen or some other cation species, such as alkali or transition metals, that act as an electron donor for the primary material, or they may be anion vacancies, which in the primary material are charged and therefore are also donors for the lattice. It is also possible to drive anionic species into the primary host material, which will become electron acceptors (or hole donors).

The primary active material may be a thin film (generally less than 50 nm thick), and is in many cases nanocrystalline, nanoporous or amorphous. The mobility of the dopant species in such nanostructured materials is much higher than in a bulk crystalline material, since diffusion can occur through grain boundaries, pores or through local structural imperfections in an amorphous material. Also, because the film is so thin, the amount of time required to drift enough dopants into or out of a local region of the film to substantially change its conductivity is relatively rapid (e.g., the time t required for a diffusive process varies as the square of the distance covered, so the time to diffuse one nanometer is one-millionth the time required to diffuse one micrometer).

The switching materials (primary active and secondary active materials) are contacted on either side by metal electrodes or wires, or on one side by a semiconductor and the other side by a metal. The contact of the metal to the switching material depletes the semiconductor of free charge carriers, so in fact the material has a net charge that depends on the identity of the dopants—positive in the case of donors and negative in the case of acceptors. The metal-semiconductor contact regions electrically resemble Schottky barriers. The traditional description of a metal-semiconductor Schottky barrier is modified by the fact that the materials are structured at the nanometer scale, and so the structural and electrical properties are not averaged over the large distances over which the theory of semiconductor-metal contacts has been developed.

Conduction of electrons through the primary active material is via quantum mechanical tunneling of the electrons. When the semi-conducting material is essentially intrinsic, the tunneling barrier is high and wide, and thus the conductivity through the switch is low (OFF state). When a significant number of dopant species have been injected into the semiconductor, the width and perhaps the height of the tunneling barrier are diminished by the potential of the charged species. This results in an increase of the conductivity of the switch (ON state).

The ability of the charged species to diffuse into and out of the primary material is substantially improved if one of the interfaces connecting the switch to the metallic or semiconducting electrodes is non-covalently bonded. Such an interface may be caused by a void in the material or it may be the result of an interface that contains a molecular material that does not form covalent bonds with the electrode, the primary switch material, or both. This non-covalently bonded interface lowers the activation energy of the atomic rearrangements that are required for drift of the ionic species in the primary material. This interface is essentially an extremely thin insulator, and adds very little to the total series resistance of the switch.

Many examples of suitable combinations are given in the foregoing reference, including oxides, sulfides, selenides, nitrides, phosphides, arsenides, chlorides, and bromides of the transition and rare earth metals, with the alkaline earth metals often being present in compounds. Further, there are the various alloys of like compounds with each other, which can have a wide range of composition if they are mutually soluble in each other. Then there are the mixed compounds, in which there are two, three or more different metal atoms combined with some number of the electronegative elements. The dopants may be anion vacancies or different valent elements doped into the host.

Specifically listed are the following materials:

oxides of Ti, Zr and Hf;

alloys of these three oxides in pairs or with all three present simultaneously (e.g., $Ti_xZr_yHf_zO_2$, where x+y+z=1);

titanates, zirconates and hafnates, which may be represented as $ABO_3$ compounds, where A is at least one divalent element and B is at least one of Ti, Zr, and Hf, and the compounds may have the perovskite structure;

alloys of these various compounds, such as $Ca_aSr_bBa_c$—$Ti_xZr_yHf_zO_3$, where a+b+c=1 and x+y+z=1;

sulfides and selenides of the transition metals with some ionic bonding character, essentially the S and Se analogues of the oxides mentioned above;

semiconducting nitrides, such as AlN, GaN, ScN, YN, LaN, rare earth nitrides, and alloys of these compounds and more complex mixed metal nitrides;

phosphides and arsenides of various transition and rare earth metals, e.g., Sc, Y, La, etc.;

semiconducting halides, such as CuCl, CuBr, and AgCl

The disclosed dopants are selected from the group consisting of hydrogen, alkali, and alkaline earth cations, transition metal cations, rare earth cations, oxygen anions or vacancies, chalcogenide anions or vacancies, nitrogen anions or vacancies, pnictide anions or vacancies, and halide anions or vacancies.

Embodiments of the present invention are directed to a new family of memristors, or memory resistors, that is based upon using a mixed-metal-valence compound, an example of which is a so-called "Magneli phase", as an electronic conducting contact (or electrode) and also a source of dopant species (such as oxygen vacancies or metal interstitials) for a semiconducting or insulating layer (the switching material), which is based upon a second (perhaps related) metal compound with a uniform and higher valence. Under an appropriate externally applied electric field (see FIG. 1), dopants (e.g., oxygen vacancies, metal interstitials or some other species) can detach from the mixed-metal-valence compound and drift into the semiconducting or insulating material, thus doping it and providing a means for electrons to more easily conduct through the switching layer (i.e. by tunneling, resonant tunneling, hopping, or any other transport process), thus lowering the electrical resistance of the semiconducting or insulating material. Upon the application of the opposite polarity electric field, the dopant species will drift back to the mixed-metal-valence compound and precipitate onto the layer. The bipolar switching process just described is essentially the definition for the operation of a memristor.

FIG. 1 depicts a memristor 100 having a structure in accordance with embodiments taught herein. The equivalent circuit is shown next to the structure, comprising a rectifier in parallel with a memristor, the combination in series with a resistor. The memristor 100 comprises a layer of a mixed-metal-valence conducting material (e.g., Magneli phase) 105 in physical contact with a layer of a fully oxidized phase 110, which may be an electron blocking layer, a semiconductor or an insulator. A first electrically conducting layer 115, such as a metal wire, makes electrical contact to the mixed-metal-valence layer 105, while a second electrically conducting layer 120, such as a metal wire, makes electrical contact to the fully oxidized phase layer 110. It will be appreciated that a Magneli phase is a sub-set of mixed-metal-valence phases. Thus, a mixed-metal-valence phase is not necessarily a Magneli phase.

A voltage V from source 125 is applied to the second conducting layer 120, while the first conducting layer is connected to ground 130.

Upon application of a voltage, charged dopants (e.g., oxygen vacancies, metal interstitials or some other species) are pulled out of the mixed-metal-valence phase and into the electron blocking layer, thus making conduction of electrons through this layer easier.

Upon application of an opposite voltage, the dopants are expelled from the electron blocking layer back to the mixed-metal-valence phase, thus decreasing the electron conduction.

Note that this mechanism for switching is explicitly bipolar—in other words, it requires voltages of opposite polarity to switch the device into a low resistance ON state and to a high resistance OFF state. The application of these voltages perturbs the equilibrium between a Magneli or mixed-metal-valent compound (the source/sink of dopants) in contact with a fully or uniformly oxidized metal compound (the electron blocking layer) that contains a small concentration of dopants—only a small number of dopants are exchanged between the source/sink and the electron blocking (semiconducting or insulating) layer, and thus the switching can be very fast (nanoseconds or faster) and low energy (picojoules or lower). This mechanism is distinguished from a "Phase-Change Memory" (PCM) switch in several ways. First, PCM is a unipolar switching mode, and therefore it is not a memristor. Second, in a PCM switch, the volume of switching material must be heated up to melt it, followed by either a fast or slow cooling process to allow the material to solidify into a high resistance amorphous or glassy phase or to a low resistance crystalline phase, respectively. This nucleated process is intrinsically slower and requires more energy than that required to perturb an equilibrium distribution of dopants between two phases.

Figure 2:
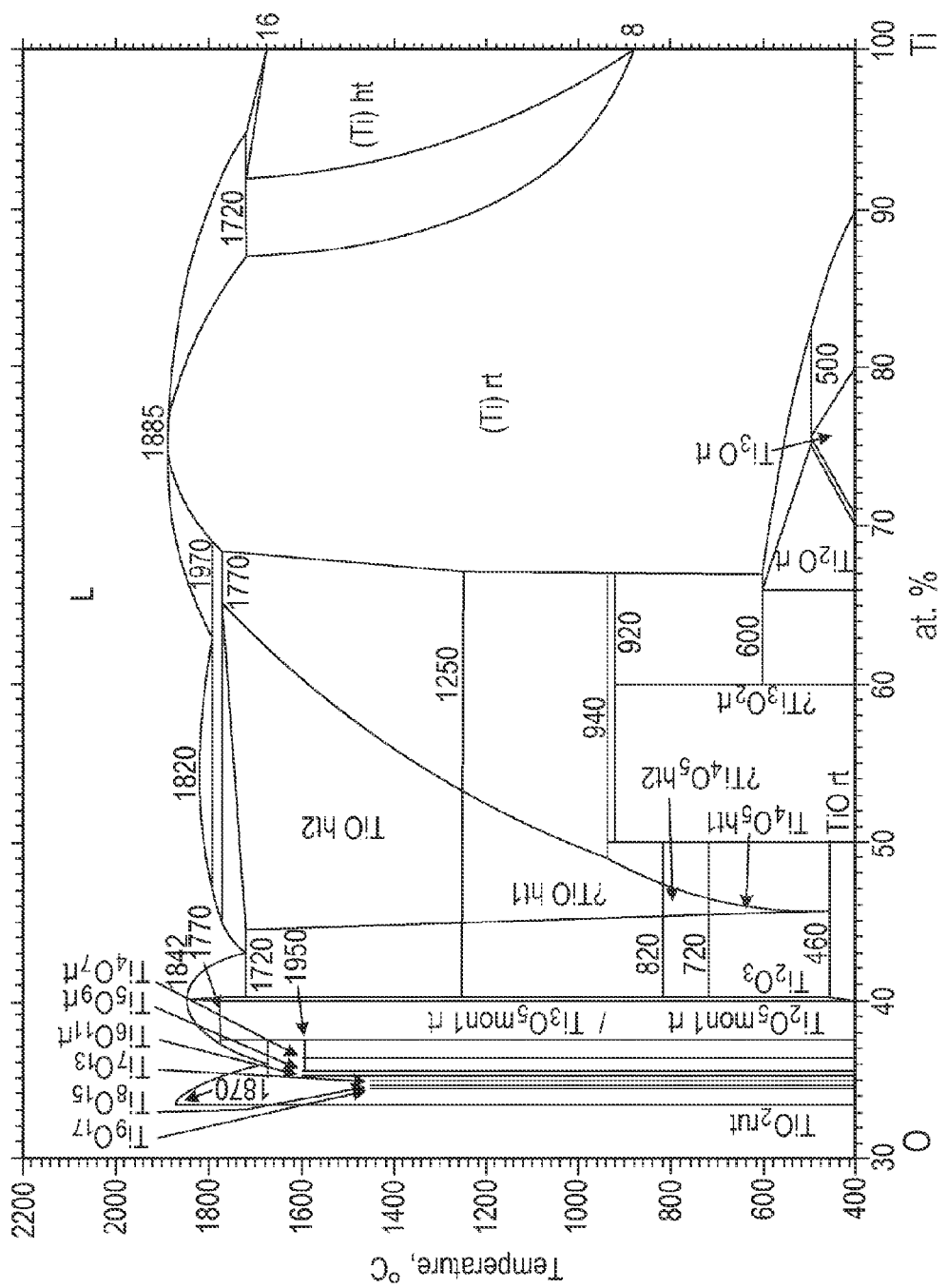
FIG. 2 is a phase diagram of the Ti—O system, illustrating mixed-metal-valence phases in this system, along with its fully oxidized phase, employed in the practice of the present invention.

The classic example of a Magneli phase, one of the well-known mixed-metal-valence compounds, is a thermodynamically stable titanium oxide material with the chemical formula $Ti_nO_{2n-1}$, where n can take on integer values greater than or equal to 3 and in general has an upper limit of 9 or so (see FIG. 2).

FIG. 2 is a conventional phase diagram of the Ti—O system, depicting the various phases of Ti—O compounds, including the mixed-metal-valence (Magneli) phases. The Ti—O system is shown, as it has several mixed-metal-valence systems that have been studied and characterized. However, the case of Ti—O is just one of many possibilities of transition metal oxide systems, many of which have such Magneli-type phases but which have not yet been fully characterized and identified.

Another way to think of these mixed-metal-valence compounds in the Ti—O system is by writing the formula in the following formal way: $(n-2) \times TiO_2 + Ti_2O_3$, which illustrates the fact that this is a mixed-metal-valence compound—i.e. the titanium in this compound exists in both the formal +4 and the +3 oxidation states. The titanium that has the +3 valence states can contribute a "free" electron to the conduction states of the compound, and thus depending on the details of the structure, it is possible for such a compound to be metallic or at least to have a relatively high conductivity, compared to fully oxidized $TiO_2$. Compounds of this type are usually metallic at room temperature, but they may undergo an ordering phase transition at lower temperatures and become semiconducting, generally with a small band gap. In any case, they are much more conductive than the "parent" or single valent compound $TiO_2$, in which the titanium has a uniform formal oxidation state of +4. Since all of the titanium valence electrons in $TiO_2$ are involved with chemical bonding with the oxygen, there are no "free" conduction electrons and thus $TiO_2$ is a wide band gap semiconductor. It is known from "Thermodynamics of oxygen defective Magneli phases in rutile: A first principles study" by L. Liborio and N. Harrison, Phys. Rev B, vol. 77, pp. 104104-1 to 104104-10 (2008) that there is a thermodynamic equilibrium among oxygen defects, titanium interstitials, the gaseous oxygen partial pressure, the various Magneli phases and rutile as a host compound. At low oxygen chemical potentials, oxygen vacancies will order in $TiO_2$ rutile to form domains of Magneli phase. However, the application of an electric field can pull charged oxygen vacancies or titanium interstitials out of the Magneli phase and cause them to drift into the (nearly) stoichiometric $TiO_2$, depending on the chemical potential of the oxygen.

Thus, one class of memristor structure involves a thin film (from 1 to approximately 20 nanometers) of $TiO_2$ deposited on top of a thin film of a Magneli phase, $Ti_nO_{2n-1}$ in the range of n from 3 to 9 (also from 1 to 20 nanometers thick). Device fabrication begins by defining a bottom metal contact or wire for the device using an appropriate combination of lithography, deposition and etching techniques. The bottom metal can be any of those commonly used for electronic circuits, including, but not limited to, platinum, palladium, ruthenium, tantalum, tungsten, niobium, iridium, copper and aluminum, and they may also have some type of barrier layer such as tungsten or titanium nitride to prevent chemical reactions between the metal of the wire and the material of the memristor. The titanium oxide films may be deposited in any fashion that produces the desired phases, for example: sputtering each material from a source target of the desired phase; using the technique of atomic layer deposition and controlling the amount of oxygen that goes into each layer to define the chemical composition; using the technique of laser ablation from targets of the appropriate compounds to deposit layers of the desired stoichiometry; or depositing a single layer of the mixed-metal-valence phase and then oxidizing the top part of the film to create the $TiO_2$ layer. Alternatively, one could deposit a single layer of $TiO_2$ and then reduce the top part of the film to produce the desired mixed-metal-valence phase. Other processes that achieve the desired goal may also be employed, such as the oxidation of a titanium or transition metal or metal alloy into the appropriate mixed-metal-valence phase (e.g., oxidation of titanium nitride or titanium carbide into a titanium mixed-metal-valence phase.

The device operation is as described previously. Application of the appropriate voltage to either the top or bottom electrode will cause an electrically charged and active species to detach from the mixed-metal-valence phase and drift into the $TiO_2$ switching layer, thus decreasing its resistance. Reversing the polarity of the voltage will cause the active species to drift back to the mixed-metal-valence phase, thus increasing the resistance of the $TiO_2$ switching layer, and thus creating the bipolar switching required for a memristor.

Accordingly, while it will be seen that many similar compounds are disclosed and claimed in the present application as in the Williams reference above, the present application pinpoints the particular phases that give rise to the memristive effect when in combination with a fully oxidized compound.

As an example, the Williams reference cited above disclosed the system $TiO_2/TiO_{2-x}$. However, it has been discovered that the oxygen-deficient compounds that operate best are those phases in the Ti—O phase system that are essentially a condensed phase of dopants within the host oxide, such that this phase is in equilibrium as a solid-state inclusion in the host maximally oxidized phase and in equilibrium with dopant species, especially oxygen (or anion) vacancies or metal atom interstitials. This condensed phase may be either crystalline or disordered, or for the purposes of a memristor it may be thermodynamically stable or metastable. As mentioned above, examples include the Magneli phases, $Ti_nO_{2n-1}$ where n ranges from 3 to 9, in combination with a fully oxidized layer, $TiO_2$. The Magneli phases can be thought of as ordered arrays of oxygen vacancies in $TiO_2$, and those vacancies can evaporate off the Magneli phase or condense onto it if the Magneli phase is in physical contact with $TiO_2$. Memristive switching in this bilayer structure then involves the electrically-induced drift of a "defect", e.g., an anion vacancy or a metal interstitial, into the fully oxidized layer to increase conductance, effectively moving the boundary between the two phases. This switching therefore involves transitions between stable phases of the Ti—O phase system, increasing the retention time to switching time ratio, which is desirable for applications. Additionally, because the initial and final states are well-defined phases, the switching occurs through a more deterministic rather than stochastic process, increasing reproducibility from cycle to cycle within a device and between different devices. Switching that depends on deterministic rather than stochastic processes is also inherently faster.

Other layer configurations of the fully oxidized phase and the mixed-metal-valence phase can also be very useful. For example, an electrode/fully oxidized phase/mixed-metal-valence phase/fully oxidized phase/electrode structure maybe used as a switchable diode where the dopants in the mixed-metal-valence phase can drift to either a top or a bottom fully oxidized phase, resulting in rectifying I-V curves with opposite rectifying directions.

FIG. 3A depicts such a structure 100', which is similar to that of FIG. 1, but fully oxidized layer 110 is denoted 110a, and an additional fully oxidized layer 110b is interposed between the first electrically conducting layer 115 and the mixed-metal-valence conducting layer 105. The device forms an invertible rectifier, or reversible diode. The equivalent circuit is shown next to the structure, comprising a rectifier with one polarity in parallel with a memristor, the combination in series with another combination comprising a rectifier with the opposite polarity in parallel with a memristor.

FIG. 3B depicts an important variation on this structure, where one of the fully oxidized layers is thicker than the other. In this structure 100", layer 110a is shown thicker than layer 110b, but the reverse situation may also be employed. The equivalent circuit is shown next to the structure.

In the case of FIG. 3B, instead of a device 100' that switches from a rectifier with one polarity to a rectifier with the opposite polarity, as the device depicted in FIG. 3A, this asymmetric device 100" will switch between a configuration that is essentially an electrically open circuit in the OFF state (two rectifiers in a "head-to-head" series connection) and a rectifier in the ON state. This configuration, forming an ON-switched diode, is the most important property for a memory circuit. The polarity of the rectifier depends on the orientation of the thin and thick layers of the fully oxidized material.

Now that a prototype memristor based on $TiO_2$ and its related mixed-metal-valence compounds has been described, several other compound pairs that will provide bipolar switching by the same mechanism are described below. While examples are given of a fully oxidized layer on a mixed-metal-valence layer (e.g., $TiO_2$ on $Ti_4O_7$), it will be appreciated that the converse is also applicable, namely, a mixed-metal-valence layer on a fully oxidized layer (e.g., $Ti_4O_7$ on $TiO_2$).

In considering other transition metal systems, there are no thermodynamically stable Magneli or other mixed-metal-valence oxides reported for zirconium and hafnium, for example, but the overall strategy of creating an oxygen deficient film in contact with a fully oxidized film is still valid, since one can always create metastable phases. In this case, the mixed-metal-valence phase is metastable, and therefore needs to be protected from undesired oxidation by appropriate passivation and circuit packaging to exclude atmospheric oxygen from the device. There are also the structures and compositions that result from using alloys of the Column IVB (of the Periodic Table) metals in order to tune the electronic and ionic properties of the layers to obtain desired properties. The structures and example compounds are listed below:

$TiO_2$ on $Ti_nO_{2n-1}$, where n ranges from 3 to 9, e.g., $TiO_2$ on $Ti_4O_7$;

$ZrO_2$ on $ZrO_{2-x}$, where x ranges from 0.01 to 0.5, more particularly, 0.1 to 0.3, e.g., $ZrO_2$ on $Zr_2O_3$;

$HfO_2$ on $HfO_{2-x}$, where x ranges from 0.01 to 0.5, more particularly 0.1 to 0.3, e.g., $HfO_2$ on $Hf_2O_3$; and $Ti_aZr_bHf_cO_2$ on $(Ti_dZr_eHf_f)_nO_{2-n-1}$, where a+b+c=1 and d+e+f=1 and n ranges from 3 to 12.

As with the oxides of titanium, the oxides of the element vanadium also display Magneli phases of the type $V_nO_{2n-1}$. Structures of the type $VO_2$ on $V_nO_{2n-1}$ will also yield a memristor structure, but in this case the $VO_2$ undergoes an insulator to metal transition at temperatures above 65° C., whereas the Magneli phases also display insulator to metal transitions but at significantly lower temperatures. Thus, the vanadium system provides the intriguing possibility of building complex memristive devices in which temperature-dependent phase transitions caused by Joule heating in a device can impart additional complexity and potential utility to the device. This would be a system in which there is more than one "state variable"—in this case, the temperature of the device would have a large impact on the resistance, and would represent another state variable besides the chemical composition of the electron blocking layer. Note that in principle, vanadium in $VO_2$ has a formal valence of +4, but that leaves one "unbound" electron per vanadium atom in the compound. However, at temperatures below 65° C., these electrons tend to spin-pair and thus induce a band gap that makes $VO_2$ semiconducting. The vanadium +5 valence compound $V_2O_5$ is known, but is a fairly chemically reactive material (oxidizing agent) that would need to be stabilized in a device structure. However, the corresponding Column VB (of the Periodic Table) +5 valence compounds $Nb_2O_5$ and $Ta_2O_5$ are very unreactive. In fact, the latter compound is used for making extremely stable capacitors. Both Nb and Ta also display thermodynamically stable oxidation states other than +5. Thus, memristors of the type $Nb_2O_5$ on $NbO_2$ or mixed valence compounds, and $Ta_2O_5$ on $TaO_2$ or mixed valence compounds, are very attractive, although the dioxides are also known to display insulator to metal transitions. Thus, Column VB of the Periodic Table yields a rich variety of memristor compounds and structures, especially when considering alloys of the different metals to stabilize compounds or improve dopant drift.

$VO_2$ on $V_nO_{2n-1}$, where n ranges from 3 to 9, e.g., $VO_2$ on $V_4O_7$;

$V_aNb_bTa_cO_2$ on $(V_dNb_eTa_f)_nO_{2n-1}$, where a+b+c=1 and d+e+f=1 and n ranges from 3 to 12;

$Nb_2O_5$ on $NbO_2$ or mixed valence compounds with Nb +5, +4, or +3 valence states, e.g., $Nb_2O_5$ on where x ranges from −0.5 to 0.5, e.g., $Nb_2O_5$ on $Nb_2O_3$; and $Ta_2O_5$ on $TaO_2$ or mixed valence compounds with Ta +5, +4, or +3 valence states, e.g., $Ta_2O_5$ on $TaO_{2+x}$; where x ranges from −0.5 to +0.5, e.g., $Ta_2O_5$ on $Ta_2O_3$.

In the case of the Column VIB metals, another type of Magneli phase is displayed by the oxides of Mo and W, in which the formula of the Mo Magneli phases is $Mo_nO_{3n-1}$, or $(n-1)\times MoO_3+MoO_2$, for which the Mo oxidation states are +6 and +4 respectively. Thus, this defines structures based on molybdenum and tungsten oxides of the following types: $MoO_3$ on $Mo_nO_{3n-1}$ and $WO_3$ on $W_nO_{3n-1}$. In this case, the analogous compound $CrO_3$ is also a strong oxidizing agent known as chromic acid, and would not be suitable for a memristor structure in its pure form. However, as part of an alloy structure, it can provide enhanced dopant mobility for a structure. Thus, the following memristor structures include:

$MoO_3$ on $Mo_nO_{3n-1}$, where n ranges from 4 to 12, e.g., $MoO_3$ on $Mo_4O_{11}$;

$WO_3$ on $W_nO_{3n-1}$, where n ranges from 4 to 12, e.g., $WO_3$ on $W_4O_{11}$; and $Cr_aMo_bW_cO_3$ on $(Cr_dMo_eW_f)_nO_{3n-1}$, where a+b+c=1 and d+e+f=1 and n ranges from 3 to 15.

Finally, another set of alloy families of mixed-metal-valence compounds may be defined by combining compounds from Columns IVB, VB and VIB of the Periodic Table, in order to further optimize electron blocking and switching properties. An example would be a maximum valent ternary alloy (two metals plus oxygen) of the type $(HfO_2)_u(Ta_2O_5)_v$ where u+v=1 to enhance electron blocking properties on top of a phase $(Ti_nO_{2n-1})_y(Mo_mO_{3m-1})_z$ where y+z=1 to enhance dopant drift (n ranges from 3 to 9 and m ranges from 4 to 12). One can see that by exhausting all possible combinations of the systems described above, this becomes a very large family of devices. In particular, one is looking to optimize several properties simultaneously, such as chemical stability, switching endurance, resistance OFF to ON ratio, switching speed and energy, state lifetime, resistance to half-select, etc. Note also that other elements from the Periodic Table are often utilized in various amounts to stabilize or otherwise alter the properties of these oxides, and those additions can also be made to the structures defined here. Such elements are often taken from Columns IIA, IIIB and VIIB of the Periodic Table, but they can also come from other families as well, including the Lanthanide elements.

There are other mixed-metal-valence systems that can also be used. For example, $Fe_2O_3$ on $Fe_3O_4$, $Ni_2O_3$ on $Ni_3O_4$, and $Co_2O_3$ on $Co_3O_4$ combine magnetic properties with electrical switching, and, of course, the various alloys of these "Group VIII" metals may be combined with each other.

Further, in addition to the mixed-metal-valence compounds that contain oxygen, there are also mixed-metal-valence compounds that contain the elements N, P, S, Cl, and Br as the anionic or oxidizing species, either alone, or incombination with each other, or in combination with O. Similar memristor structures can be constructed with appropriate maximum valence and mixed-metal-valence metal compound of these elements as well.

Finally, there are pseudo-binary alloys, such as $HfWO_5$ on $HfWO_4$, that may be used to combine properties from different systems.

In principle, it is always possible to get the highest oxidation state on the top of a film by introducing oxygen during the final stage of deposition or by an intentional oxidation of the top layer of a suboxide film.

In order to prepare a mixed-metal-valence, or Magneli, phase, one first needs to get the right compositions (metal/O ratio), and then annealing may be involved if a crystalline phase is desired. There are several methods to get the right compositions during fabrication. For example, the layer can be deposited by sputter deposition or Pulsed Laser Deposition (PLD) from a target with the desired mixed-metal-valence phase composition, where a small partial pressure of oxygen in the chamber may help to adjust the stoichiometry of the film to compensate any oxygen loss during the film deposition.

In some other cases, it may be desirable to anneal an off-composition oxide film under a well-defined oxygen thermodynamic potential to either oxidize or reduce the off-composition oxide film to achieve the mixed-metal-valence phase compositions. The oxygen thermodynamic potential can be adjusted to select the free energy of formation of the desired mixed-metal-valence phase. In practice, in order to achieve the required oxygen potential, one can use a gas mixture of $CO_2/CO$ (or some others, like $H_2O/H_2$) with a certain partial pressure ratio. By changing the ratio of $CO_2/CO$, one can achieve different oxygen potentials. This method can be even integrated into an atomic layer deposition (ALD) process.

There are several ways to identify the appropriate phase, including performing X-ray diffraction if the film is crystalline (and the film can be crystallized by annealing it). Alternatively, X-ray photoemission can be performed and the intensities of the appropriate chemically shifted photoemission peaks can be so monitored. For example, $Ti^{+4}$ and $Ti^{+3}$ can easily be resolved. In yet another technique, X-ray absorption measurements can be performed and intensities of the chemically shifted absorption peaks can be monitored. Still further, Rutherford backscattering can be performed and the ratio of oxygen to metal in the film can be determined. Finally, the electrical conductivity of the film can be measured, or, alternatively, the temperature dependence of the electrical conductivity can be measured and compared with calibration standards. Many of these compounds have electrical phase transitions at particular temperatures that are good identifiers. In practice, one might actually perform several of these techniques and compare the results to get a consensus.

The memristor devices disclosed herein may find use in a variety of systems, including crossbar memories, such as disclosed in the above-mentioned Williams reference, as well as in a number of other applications, including synapses. Further, these devices may find use in multi-terminal switches, such as disclosed in R. Stanley Williams, "Multi-terminal Electrically Actuated Switch", US Patent Publication 2008/0079029A1, Apr. 3, 2008.

What is claimed is:

1. A memristor based on mixed-metal-valence compounds comprising:
   a first electrode;
   a second electrode;
   a layer of a mixed-metal-valence phase in physical contact with at least one layer of a fully oxidized phase, the mixed-metal-valence phase being essentially a condensed phase of dopants for the fully oxidized phase that drift into and out of the fully oxidized phase in response to an applied electric field so as to change resistance of the fully oxidized phase,
   wherein one of the first and second electrodes is in electrical contact with the layer of the mixed-metal-valence phase and wherein an other of the first and second electrodes is in electrical contact with the layer of the fully oxidized phase, and
   wherein the mixed-metal-valence phase and the fully oxidized phase each contain a metal component, where the metal component is identical for both phases.

2. The memristor of claim 1 wherein the mixed-metal-valence phase is a Magneli phase.

3. The memristor of claim 1 wherein the mixed-metal-valence phase includes metals selected from the group consisting of Ti, Zr, Hf, V, Nb, Ta, Mo, W, Cr, Fe, Ni, and Co and combinations thereof, in crystalline or disordered phases.

4. The memristor of claim 1 wherein the mixed-metal-valence phase includes anions that are selected from the group consisting of O, N, P, S, Cl and Br and combinations thereof as the oxidizing species.

5. The memristor of claims 1 wherein the dopants are anion vacancies or metal interstitials in the fully oxidized layer.

6. The memristor of claims 1 wherein the fully oxidized phase is selected from the group consisting of an electron blocking layer, a semiconductor and an insulator.

7. The memristor of claims 1 comprising the layer of the mixed-metal-valence phase sandwiched between two layers of the fully oxidized phase, with those two layers being of equal thickness and the first and second electrodes each electrically contacting a layer of the fully oxidized phase.

8. The memristor of claims 1 comprising the layer of the mixed-metal-valence phase sandwiched between two layers of the fully oxidized phase, with those two layers being of unequal thickness and the first and second electrodes each electrically contacting a layer of the fully oxidized phase.

9. The memristor of claim 1 comprising one of the following combinations:
   $TiO_2$ on $Ti_nO_{2n-1}$, where n ranges from 3 to 9;
   $ZrO_2$ on $ZrO_{2-x}$, where x ranges from 0.01 to 0.5;
   $HfO_2$ on $HfO_{2-x}$, where x ranges from 0.01 to 0.5;
   $Ti_aZr_bHf_cO_2$ on $(Ti_dZr_eHf_f)_nO_{2n-1}$, where a+b+c=1 and d+e+f=1 and n ranges from 3 to 15;
   $VO_2$ on $V_nO_{2n-1}$, where n ranges from 3 to 9;
   $V_aNb_bTa_cO_2$ on $(V_dNb_eTa_f)_nO_{2n-1}$, where a+b+c=1 and d+e+f=1 and n ranges from 3 to 12;

$Nb_2O_5$ on $NbO_2$;

$Nb_2O_5$ on mixed valence compounds with Nb +5 and +4 valence states, including $Nb_2O_5$ on $NbO_{2+x}$, where x ranges from −0.5 to +0.5;

$Ta_2O_5$ on $TaO_2$;

$Ta_2O_5$ on mixed valence compounds with Ta +5 and +4 valence states, including $Ta_2O_5$ on $TaO_{2+x}$, where x ranges from −0.5 to +0.5;

$MoO_3$ on $Mo_nO_{3n-1}$, where n ranges from 4 to 12;

$WO_3$ on $W_nO_{3n-1}$, where n ranges from 4 to 12;

$Cr_aMo_bW_cO_3$ on $(Cr_dMo_eW_f)_nO_{3n-1}$, where a+b+c=1 and d+e+f=1 and n ranges from 4 to 15;

$Fe_2O_3$ on $Fe_3O_4$;

$Ni_2O_3$ on $Ni_3O_4$; and $Co_2O_3$ on $Co_3O_4$.

10. A method of preparing the memristor of claims 1, comprising forming in either order the layer of the mixed-metal-valence phase and the layer of the fully oxidized phase, one on the other.

11. The method of claim 10 comprising attaching first and second electrodes, one to the layer of the mixed-metal-valence phase and one to the layer of the fully oxidized phase or one each to the layers of the fully oxidized phase.

12. A method of operating the memristor of claims 1, the method comprising applying a voltage from a source to the second electrode while the first electrode is connected to ground, wherein:
- upon application of a voltage, charged dopants are pulled out of the layer of the mixed-metal-valence phase and into the fully oxidized phase, thus making conduction of electrons through the fully oxidized phase easier, and
- upon application of an opposite voltage, dopants are expelled from the fully oxidized phase back to the layer of the mixed-metal-valence phase, thus decreasing the electron conduction.

13. A reversible diode comprising:
is a first electrode;
a second electrode;
a layer of a mixed-metal-valence phase in physical contact with and sandwiched between two layers, each of a fully oxidized phase, the mixed-metal-valence phase being essentially a condensed phase of dopants for the fully oxidized phase that drift into and out of the fully oxidized phase in response to an applied electric field so as to change resistance of the fully oxidized phase, wherein the fully oxidized phases have substantially the same thickness and wherein each of the first and second electrodes is in electrical contact with a layer of a fully oxidized phase, and wherein the mixed-metal-valence phase and the fully oxidized phase each contain a metal component, where the metal component is identical for both phases.

14. An ON-switched diode comprising:
a first electrode;
a second electrode;
a layer (105) of a mixed-metal-valence phase in physical contact with and sandwiched between two layers, each of a fully oxidized phase, the mixed-metal-valence phase being essentially a condensed phase of dopants for the fully oxidized phase that drift into and out of the fully oxidized phase in response to an applied electric field so as to change resistance of the fully oxidized phase, wherein the fully oxidized phases have different thicknesses and wherein each of the first and second electrodes is in electrical contact with a layer of a fully oxidized phase, and wherein the mixed-metal-valence phase and the fully oxidized phase each contain a metal component, where the metal component is identical for both phases.

* * * * *

UNITED STATES PATENT AND TRADEMARK OFFICE
CERTIFICATE OF CORRECTION

PATENT NO. : 8,891,284 B2  
APPLICATION NO. : 13/383572  
DATED : November 18, 2014  
INVENTOR(S) : Williams et al.

Page 1 of 1

It is certified that error appears in the above-identified patent and that said Letters Patent is hereby corrected as shown below:

On the title page, Item (75), line 5, delete "Milbrae," and insert -- Millbrae, --, therefor.

In the Claims

Column 10, line 41, Claim 4, delete "CI" and insert -- Cl --, therefor.

Column 10, line 43, Claim 5, delete "claims" and insert -- claim --, therefor.

Column 10, line 45, Claim 6, delete "claims" and insert -- claim --, therefor.

Column 10, line 48, Claim 7, delete "claims" and insert -- claim --, therefor.

Column 10, line 53, Claim 8, delete "claims" and insert -- claim --, therefor.

Column 11, line 4, Claim 9, delete "to+0.5;" and insert -- to +0.5; --, therefor.

Column 11, line 16, Claim 10, delete "claims" and insert -- claim --, therefor.

Column 11, line 24, Claim 12, delete "claims" and insert -- claim --, therefor.

Column 12, line 2, Claim 13, delete "is a" and insert -- a --, therefor.

Signed and Sealed this  
Second Day of June, 2015

Michelle K. Lee  
*Director of the United States Patent and Trademark Office*